US012484186B2

(12) United States Patent
Björneklett et al.

(10) Patent No.: US 12,484,186 B2
(45) Date of Patent: Nov. 25, 2025

(54) COOLING OF ELECTRONIC COMPONENTS WITH AN ELECTROHYDRODYNAMIC FLOW UNIT

(71) Applicant: APR Technologies AB, Enköping (SE)

(72) Inventors: Are Björneklett, Västerås (SE); Peter Nilsson, Sundbyberg (SE); Robert Thorslund, Sigtuna (SE)

(73) Assignee: APR Technologies AB (SE)

( * ) Notice: Subject to any disclaimer, the term of this patent is extended or adjusted under 35 U.S.C. 154(b) by 597 days.

(21) Appl. No.: 17/437,610

(22) PCT Filed: Mar. 10, 2020

(86) PCT No.: PCT/EP2020/056370
§ 371 (c)(1),
(2) Date: Sep. 9, 2021

(87) PCT Pub. No.: WO2020/182820
PCT Pub. Date: Sep. 17, 2020

(65) Prior Publication Data
US 2022/0141997 A1 May 5, 2022

(30) Foreign Application Priority Data
Mar. 11, 2019 (SE) .................... 1950305-1

(51) Int. Cl.
H05K 7/20 (2006.01)
F28F 13/16 (2006.01)
(52) U.S. Cl.
CPC ......... H05K 7/20263 (2013.01); F28F 13/16 (2013.01); H05K 7/20272 (2013.01); F28F 2250/08 (2013.01)

(58) Field of Classification Search
CPC ........... H05K 7/20263; H05K 7/20272; H05K 7/20236; H05K 7/20009; F28F 13/16;
(Continued)

(56) References Cited

U.S. PATENT DOCUMENTS 2,748,356 A * 5/1956 Kaehni ................... H01F 27/12
336/62
3,135,207 A * 6/1964 Brown ................... B01D 61/56
359/228

(Continued)

FOREIGN PATENT DOCUMENTS

EP 1748688 A2 * 1/2007 ............. H01L 23/44
EP 1936685 A2 * 6/2008 ........... H01L 23/473
(Continued)

OTHER PUBLICATIONS

FR 3063806 A1, Cited in European Office Action dated Oct. 18, 2023, in related European Patent Application No. 20711547.8.
(Continued)

Primary Examiner — Eric S Ruppert
Assistant Examiner — Kirstin U Oswald
(74) Attorney, Agent, or Firm — Condo Roccia Koptiw LLP

(57) ABSTRACT

An arrangement for thermal management is disclosed, wherein a heat generating component is arranged within an enclosure, defined by an enclosure wall and in thermal contact with a thermal management fluid. The arrangement comprises an electrohydrodynamic flow unit, comprising a first and a second electrode, for controlling the flow of fluid within the enclosure.

13 Claims, 3 Drawing Sheets

(58) Field of Classification Search
CPC .... F28F 2250/08; F28D 15/025; H01L 23/46; H01L 23/473
USPC .......................................................... 165/96
See application file for complete search history.

(56) References Cited

U.S. PATENT DOCUMENTS

| | | | | |
|---|---|---|---|---|
| 3,448,791 | A * | 6/1969 | Clark | H10N 15/00 62/3.1 |
| 4,515,206 | A * | 5/1985 | Carr | F28F 13/16 165/96 |
| 5,398,160 | A * | 3/1995 | Umeda | H01L 23/057 257/713 |
| 6,181,718 | B1 * | 1/2001 | Kobayashi | H01S 5/02251 372/38.1 |
| 6,201,696 | B1 * | 3/2001 | Shimizu | H01L 24/49 361/708 |
| 6,437,664 | B1 * | 8/2002 | Meppelink | H01G 4/35 333/182 |
| 7,021,369 | B2 * | 4/2006 | Werner | H01L 23/473 257/E23.098 |
| 8,274,228 | B2 * | 9/2012 | MacDonald | G06F 1/20 315/111.81 |
| 10,361,057 | B2 | 7/2019 | Tsunoda et al. | |
| 11,244,816 | B2 * | 2/2022 | Birmingham | H10D 64/01 |
| 2003/0062149 | A1 * | 4/2003 | Goodson | H01L 23/473 257/E23.098 |
| 2004/0168447 | A1 * | 9/2004 | Sugito | F28D 15/0266 257/E23.098 |
| 2004/0190254 | A1 | 9/2004 | Hu et al. | |
| 2006/0131737 | A1 * | 6/2006 | Im | H01L 23/473 257/E23.098 |
| 2008/0014675 | A1 * | 1/2008 | Kameyama | B82Y 10/00 257/E33.001 |
| 2008/0197779 | A1 * | 8/2008 | Fisher | F28F 13/16 257/E23.099 |
| 2008/0302514 | A1 * | 12/2008 | Ouyang | F28F 13/16 165/104.33 |
| 2009/0057882 | A1 * | 3/2009 | Gerbsch | H01L 23/473 257/E23.098 |
| 2010/0013072 | A1 * | 1/2010 | Hasegawa | H01L 23/473 257/E25.027 |
| 2010/0116469 | A1 * | 5/2010 | Jewell-Larsen | G06F 1/203 165/104.34 |
| 2010/0139306 | A1 * | 6/2010 | Krenik | F25B 9/004 62/402 |
| 2010/0170660 | A1 * | 7/2010 | Wang | F28D 15/046 165/122 |
| 2010/0230087 | A1 * | 9/2010 | Ouyang | G05D 23/192 165/185 |
| 2011/0139408 | A1 * | 6/2011 | Jewell-Larsen | F28F 13/16 156/60 |
| 2011/0149252 | A1 * | 6/2011 | Schwiebert | H05K 7/20136 361/231 |
| 2011/0194248 | A1 * | 8/2011 | Nakasaka | H01L 25/112 361/689 |
| 2011/0303399 | A1 * | 12/2011 | Sakimichi | H01L 23/36 165/185 |
| 2012/0000627 | A1 * | 1/2012 | Jewell-Larsen | B03C 3/08 165/104.34 |
| 2012/0121487 | A1 * | 5/2012 | Jewell-Larsen | H01L 23/467 422/171 |
| 2013/0021715 | A1 * | 1/2013 | Jewell-Larsen | B03C 3/743 361/225 |
| 2014/0034283 | A1 | 2/2014 | Lee et al. | |
| 2017/0092565 | A1 * | 3/2017 | Chen | H05K 7/20281 |
| 2017/0162475 | A1 * | 6/2017 | Frey | H01L 23/473 |
| 2017/0263532 | A1 * | 9/2017 | Fukuoka | H10D 12/441 |
| 2018/0116076 | A1 * | 4/2018 | Dede | H01L 23/473 |
| 2018/0166359 | A1 * | 6/2018 | Fukuoka | H01L 23/367 |

FOREIGN PATENT DOCUMENTS

| | | | |
|---|---|---|---|
| EP | 3 405 976 A1 | 11/2018 | |
| FR | 3063806 A1 | 9/2018 | |
| JP | 2002-316873 A | 10/2002 | |
| JP | 2010147286 A | 7/2010 | |
| JP | 2012-109451 A | 6/2012 | |
| JP | 2014-502752 A | 2/2014 | |
| JP | 2014212625 A | 11/2014 | |
| JP | 2015-094568 A | 5/2015 | |
| JP | 2015-231013 A | 12/2015 | |
| JP | 2017-027873 A | 2/2017 | |
| WO | 99/51069 A2 | 10/1999 | |
| WO | 2012088074 A2 | 6/2012 | |
| WO | WO-2016195570 A1 * | 12/2016 | ......... H05K 7/20272 |
| WO | 2017/127017 A1 | 7/2017 | |
| WO | WO-2018172659 A1 * | 9/2018 | ............ F28F 13/125 |
| WO | WO-2018232395 A1 * | 12/2018 | .............. F28F 13/16 |

OTHER PUBLICATIONS

JP 2014212625 A, Cited in European Office Action dated Oct. 18, 2023, in related European Patent Application No. 20711547.8.

JP 2010147286 A, Cited in European Office Action dated Oct. 18, 2023, in related European Patent Application No. 20711547.8.

JP 2012-109451, Cited in Japanese Office Action dated Apr. 16, 2024, in related Japanese Patent Application No. 2021554757.

JP 2015-231013, Cited in Japanese Office Action dated Apr. 16, 2024, in related Japanese Patent Application No. 2021554757.

JP 2015-094568, CIted in Japanese Office Action dated Apr. 16, 2024, in related Japanese Patent Application No. 2021554757.

JP 2002-316873, Cited in Japanese Office Action dated Apr. 16, 2024, in related Japanese Patent Application No. 2021554757.

* cited by examiner

COOLING OF ELECTRONIC COMPONENTS WITH AN ELECTROHYDRODYNAMIC FLOW UNIT

CROSS-REFERENCE TO RELATED APPLICATIONS

This application is the National Stage Entry under 35 U.S.C. § 371 of Patent Cooperation Treaty Application No. PCT/EP2020/056370, filed Mar. 10, 2020, which claims priority from Sweden Application No. 1950305-1, filed Mar. 11, 2019, the contents of each of which are hereby incorporated by reference herein in their entireties.

TECHNICAL FIELD

The invention disclosed herein relates to the field of thermal management, and more specifically thermal management of small-scale heat generating components.

BACKGROUND

The performance of electronic systems is often limited by the thermal management techniques available. Smaller components with higher power dissipation means greater heat generation in smaller areas. As a result, more efficient thermal management is required for keeping the components within an appropriate temperature range. In other words, there is a growing need for increased efficiency, both in terms of volume requirements and energy.

One attempt to address these issues is the use of immersion cooling, in which a dielectric fluid, which is in direct contact with the electronic device to be cooled, is being circulated using a pump unit. The pump unit may be disposed to actively pump the dielectric fluid onto the electronic device. This does however require nozzles for directing the flow towards the electronic device—a technology that is known to be both expensive and bulky. Hence, there is a need for smaller and more efficient technologies for thermal management in connection with heat generating components.

SUMMARY

It is an object of at least some of the embodiments of the present invention to overcome, or at least alleviate, the above mentioned drawbacks. In particular, it is an object to provide an arrangement allowing for an improved efficiency of the flow of a thermal management fluid. It is a particular object to improve the efficiency of a circulating dielectric fluid in an electrohydrodynamic, EHD, system.

To better address one or more of these concerns, an arrangement having the features defined in the independent claim is provided. Preferable embodiments are defined in the dependent claims.

According to a first aspect, an arrangement for thermal management is provided, wherein a heat generating component is arranged within an enclosure and in thermal contact with a thermal management fluid, such as for example a dielectric liquid.

The arrangement comprises a first electrohydrodynamic, EHD, flow unit arranged within the enclosure. The first EHD flow unit comprises a first electrode and a second electrode arranged offset from the first electrode. The first flow unit may be configured to control a flow of the thermal management fluid between the first and the second electrode so as to affect a flow of the fluid within the enclosure. The flow unit may for example be arranged to direct the fluid towards the heat generating component, and/or away from the component. The heat generating component may for example comprise a processor, an electronic circuit, or chip, e.g. in the form of a flip chip device, a tape bonded device, a wire bonded device, or otherwise bonded devices, a printed circuit board or a device mounted on such a board. In one example, the heat generating component may be a battery or capacitor.

Some embodiments may comprise multiple heat generating components located within the same enclosure, such that a plurality of components may be cooled simultaneously, within the same arrangement.

The first flow unit may be activated by applying a voltage difference between the first and second electrodes of the flow unit. The electric field generated by the electrodes may bring the fluid to a flow. By deactivating, or turning off the flow unit, the flow unit may further be put in an operational mode wherein the flow through the flow unit may be reduced or eliminated. This effect may be used to further increase the control of the fluid and thus the cooling effect. The flow unit may be deactivated e.g. by reducing or removing the voltage difference between the electrodes, or applying a voltage difference counteracting a flow through the flow unit.

The first electrode may also be referred to as an "emitter" or "emitter electrode", whereas the second electrode may be referred to as "collector" or "collector electrode". During use, the emitter may be adapted to emit electrons into the fluid and/or to negatively charge matter, such as particles or impurities of the fluid, in a close proximity of the emitter.

The present inventive concept is particularly advantageous when used in combination with a dielectric liquid, which is an example of a thermal management fluid that can be brought in direct contact with the heat generating component. The use of the EHD flow unit allows for a flow of the liquid to be directed in a specific direction without using for example manifolds and nozzles.

According to some embodiments, the arrangement may comprise a plurality of EHD flow units, which may be configured in a similar way as the first EHD flow unit mentioned above. Thus, according to an embodiment, the arrangement may comprise a first and a second electrohydrodynamic, EHD, flow unit, arranged within the enclosure, wherein the first flow unit may be configured to direct the flow towards the heat generating component, and the second flow unit may be configured to direct the flow away from said component.

The present aspect is advantageous in that by arranging the EHD flow units within the enclosure such that they are directed towards the component, as well as away from it, a more precise control of the flow and hence a more efficient cooling may be achieved.

The number and configuration of the flow units within the enclosure may be determined by the desired flow to be achieved. For example, flow units may be positioned in a grid structure, either in a common plane or in different layers. This allows for improved control of the fluids' flow in the enclosure, and may make it possible to target certain areas of the heat generating component, for example its sides, underneath the component or hot spots in general. This also means that certain areas may be exposed to less flow, should that be required.

This specific targeting is made possible by the relative orientation of the electrodes forming the flow unit. Furthermore, the relative orientation of the emitter and collector electrodes may affect the angle of the flow towards the component, or, in some examples, the angle of incidence of the flow on the component. The direction of the flow may for example be perpendicular to a surface of the component, parallel to a surface of the component, or in a specific angle there between. The orientation and configuration of the flow units may be tailored for a specific application, and the arrangement may therefore be adaptable to a number of different component and thermal management requirements.

As already mentioned, the thermal management arrangement may be configured to operate with thermal management fluids that are capable of being accelerated by means of the EHD effect. Examples of such fluids, i.e. liquids and gases, that can be pumped by means of embodiments of the invention include e.g. dielectrics such as acetone, alcohols, helium, nitrogen, and fluorocarbon-based fluids such as e.g. Fluorinert™ or Novec™. More specifically, the thermal management fluid may be a dielectric fluid suitable for immersion cooling technologies.

In some embodiments, at least one of the first and second electrodes of at least one flow unit may be arranged on the heat generating component. This would mean utilizing a surface of the heat generating component as part of a flow unit, either as a first electrode or as a second electrode, allowing at least a portion of the heat generating component to involved as either a collector or emitter electrode. This may provide an increase in the cooling effect, since the electrode arranged on the component may cause the flow to be drawn to, or impinge directly on, the heat generating component.

In further embodiments, the electrode may be formed by providing an electrically conductive layer on a surface of the heat generating component. This electrically conductive layer may advantageously comprise a material that has a relatively good ability of emitting/receiving electrons. Alternatively, or additionally, the electrically conductive layer may be configured to improve the thermal transfer to or from the component. Further, the material of the layer may be chemically stable, or inert, in relation to the pumped fluid. Examples of layers for improving the emission/absorption of electrons and/or thermal transfer include 2D and 3D films, for example comprising graphite or graphene. The graphene may for example be provided in one or several layers, such as 2D layers, or in a foam. It is appreciated that the arrangement in addition to the above mentioned electrodes further may comprise a layer or a coating provided in order to improve heat transfer to/from the thermal management fluid. Such a layer, or coating, may in some examples comprise graphite or graphene and may be arranged on a surface of the heat generating component, or on a surface defining the enclosure.

According to one embodiment of the invention, a wall section of the enclosure may function as an electrode. This has the advantage that a larger portion of the enclosing structure may function as either collector or emitter and thus increase efficiency of the flow. This may also function as a space efficient solution compared to embodiments having separate flow units, i.e., flow units arranged within the enclosure without forming part of the enclosure wall and/or component. Further embodiments may utilize both the heat generating component and a wall section as electrodes.

According to one embodiment, a plurality of flow units may share one or more electrodes. For example, one electrode may function as the collector unit for a multitude of electrodes used as emitter units. The opposite formation, utilising one emitter electrode and a plurality of smaller collector electrodes is also possible.

According to another embodiment of the current invention, a plurality of flow units may be positioned so as to include collector electrodes arranged on both the heat generating component and an inside of the enclosure wall. The emitter electrodes may then be placed in between the collectors, on varying distances to the collector electrodes. The distance between an emitter electrode and a collector electrode may determine the direction the flow will take. Hence, the emitter electrodes arranged closer to the wall may cause a flow towards said wall and thus form a flow unit having its collector electrode positioned on said wall. The emitter electrodes located closer to the heat generating component may form a flow unit directed towards said heat generating component, having its collector electrode positioned on said component. In other words, the distance between the emitter electrode and the collector electrode may define the orientation of the flow unit.

According to some embodiments, the electrode may comprise a variety of surface structures. The surface may for example be shaped as peaks or provided with a high surface roughness so as to increase the surface area. A relatively large contact surface between the electrodes and the passing fluid may facilitate the interaction between the electrode and the fluid. For example, this may facilitate thermal transfer as well as the injection or absorption of ions or electrons.

According to some embodiments, the enclosure may be defined as a volume surrounded by an enclosing barrier, such as e.g. an enclosure wall. The enclosure wall may be attached to a substrate, or on the heat generating component, which hence may form part of the barrier defining the enclosed volume. According to some embodiments, the enclosure wall may be configured to be attached to an interposer, which may also be referred to as a fan out substrate or a hybrid substrate/carrier, which may hold the component to be cooled. The interposer may function as an adapter to hold small pitch contacts of a device and provide a connection to larger pitch contacts.

According to some embodiments, the enclosed volume may form a closed system in which the fluid may circulate to transfer heat from the component to the enclosure wall. According to other embodiments, the enclosure wall may be provided with inlets and outlets for circulation of thermal management fluid to external parts, such as pumps and heat exchangers.

According to some embodiments, the enclosure may be arranged in thermal contact with a heat exchanger, for example, a carbon fibre structure or a fluid tube for transferring heat from the enclosure. The heat exchanger may for example be attached on top of the enclosure for dissipating heat transferred away from the component. In some embodiments, a thermal interface material, such as graphene, may be arranged between the enclosure wall and the heat exchanger so as to improve the heat transfer.

Further objectives of, features of and advantages with the present invention will be apparent when studying the following detailed disclosure, the drawings and the appended claims. Those skilled in the art realise that different features of the present invention, even if recited in different claims, can be combined in embodiments other than those described in the following.

BRIEF DESCRIPTION OF DRAWINGS

The above, as well as additional objects, features and advantages of the present invention, will be better understood through the following illustrative and non-limiting detailed description of embodiments of the present invention. Reference will be made to the appended drawings, on which.

All the figures are schematic, generally not to scale, and generally only show parts which are necessary in order to elucidate the invention, whereas other parts may be omitted or merely suggested.

DETAILED DESCRIPTION

Figure 1:
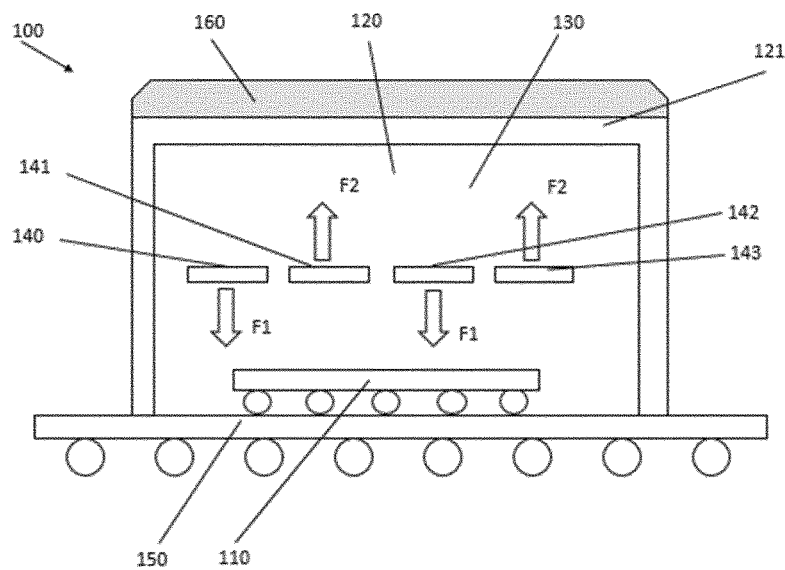
FIG. 1 is a schematic cross sectional view of a thermal management system comprising an enclosure, a heat generating component and a plurality of flow units arranged within the enclosure, according to some embodiments of the present invention.

FIG. 1 shows a thermal management system 100 comprising a heat generating component 110 attached to an interposer 150, and an enclosure wall defining an enclosure 120. The heat generating component 110 may comprise, for example, flip chip as shown in the present figure, a wire bonded component, or a tape automated bonded device being e.g. a processor. In some examples, the heat generating component may be a capacitor or a battery. Within the enclosure 120, a thermal management fluid may be provided. The thermal management fluid may be a cooling substance, for example comprising dielectric gas, boiling liquid, or a dielectric liquid 130. In case the thermal management fluid is a utilised as a boiling liquid, the enclosure wall may have a portion, such as a ceiling, forming a porous or capillary structure for allowing gas to escape the enclosure.

The embodiment displayed suggests a closed system where the dielectric fluid 130 is circulated within the enclosure 120, whilst other embodiments may comprise inlets and outlets allowing fluid to circulate out of, and in to, the enclosure 130.

Within the enclosure 130, the fluid may be caused to flow using flow units 140,141,142,143. A flow unit 140 may comprise a first and a second electrode, and a flow F may be generated by applying a voltage over the electrodes. Decreasing or terminating the electric field between the electrodes may cause the flow F to decrease or stop, and the cooling effect may through this be decreased to achieve an optimal temperature for the heat generating component 110. In this embodiment, the flow units 140-143 are located in between the heat generating component 110 and the enclosure wall 121. It will however be appreciated that other embodiments may comprise flow units located around and/ or under the heat generating component 110. In some examples, one or several flow units 110 may be arranged between the solder bumps of the heat generating component 110 so as to further improve the flow of fluid under the component 110.

In the present embodiment, the flow units are positioned such that every other flow unit 140, 142 create a flow F1 towards the heat generating unit 110 and the remaining flow units 141,143 create a fluid flow in a direction F2 away from the component 110. Further, a heat exchanger 160 may be arranged in thermal contact with the enclosure wall 121. The heat exchanger 160 may form a heat pipe, heat sink or similar structures for transferring heat energy away from the fluid. Other embodiments may provide the heat exchanger 160 on the inside of the wall and connected to external pump arrangements.

Figure 2A:
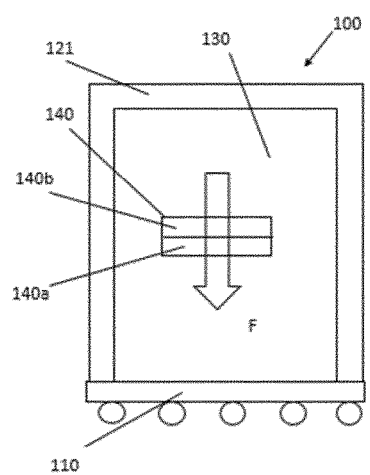
FIGS. 2a, 2b and 2c are schematic cross sectional views of different electrode configurations in flow units.
Figure 2B:
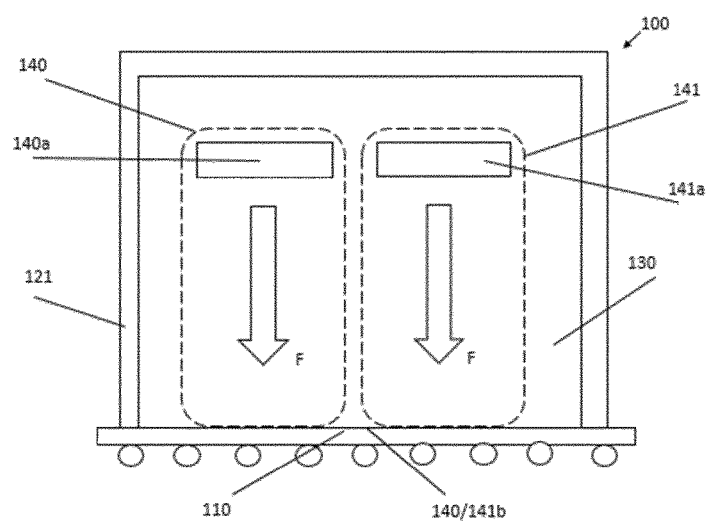
Figure 2C:
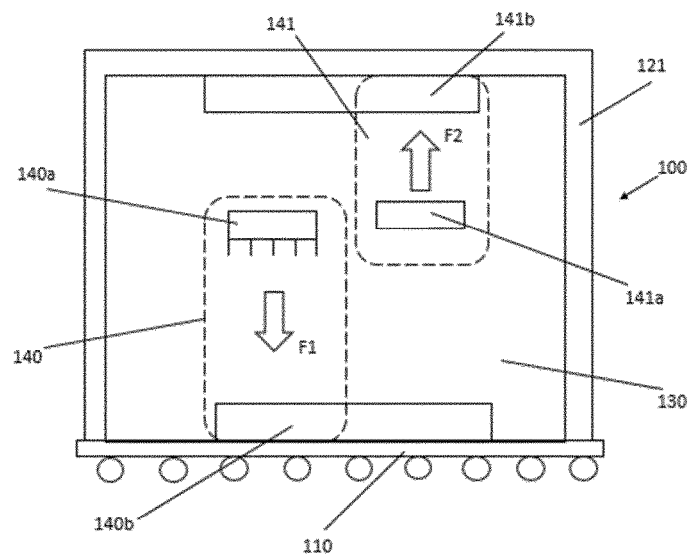

FIGS. 2a, 2b and 2c show embodiments of a thermal management system 100 which may be similarly configured as the arrangement discussed in connection with FIG. 1. In these examples, the flow units 140 comprise a first electrode 140a, which may be referred to as an emitter electrode, and a second electrode 140b, which may be referred to as the collector electrode. In the shown arrangements, all flow units may be submerged in dielectric liquid 130. As illustrated, the enclosure 120 may be defined by the enclosure wall 121 and the heat generating component 110, onto which the enclosure wall 121 may be sealingly attached.

FIG. 2a shows a first flow unit 140 comprising the first electrode 140a and second electrode 140b placed together in one unit. A voltage applied to the electrodes 140a and 140b may cause the dielectric fluid flowing in the F direction, towards a heat generating component 110.

FIG. 2b displays two flow units 140, 141 (indicated by dashed lines), wherein the first electrodes 140a, 141a of the respective flow units 140, 141 are separated from the second electrodes 140/141b, and the resulting flow F directed towards the component. In this embodiment, the first, emitter, electrodes are arranged between the component 110 and the enclosure wall 121, whilst the second, collector, electrode 140/141b is located on the surface of the heat generating component 110. With a voltage applied, the first electrodes 140a, 141a may create a flow F of dielectric fluid toward the heat generating component 110. Furthermore, in FIG. 2b, the flow units 140 and 141 are shown to have one shared second electrode 140/141b, this meaning the second electrode 140/141b may function as a collector for multiple first electrodes 140a,141a.

In FIG. 2c, the second electrodes 140b, 141b are provided on both the top and the bottom of the figure, i.e., both on the inside or ceiling of the enclosure wall 121 and on the top surface of the heat generating component 110. The first electrodes 140a, 141a may be located in between the ceiling of the enclosure wall 121 and the top surface of the component 110. Flow unit 140 is directing a flow F1 downwards, i.e., towards the component 110, whilst 141 is directing a flow F2 upwards, towards the ceiling of the enclosure.

The different directions of the flow F1, F2 may be achieved due to at least two different, independent mechanisms. The first mechanism is the electron emitting structures, illustrated by the first electrode 140a which is shown to have surface structures that facilitates electron emission. In this embodiment they are depicted as tips or needles pointing in a downward direction and determining the emitting direction of the electrode 140a.

The second mechanism is the relative distance between the electrodes. The first electrode 141a has flow direction determined by the distance to the second electrode 140b, 141b. The shortest distance between first electrode 140a, 141a and second electrode 140b, 141b defines the direction of the flow F. In FIG. 2c, electrode 141a is located closer to the collector electrode 141b arranged on the enclosure ceiling than to the collector electrode 140b arranged on the component, and therefore form flow unit 141 directing the flow away from the component.

Figure 3A:
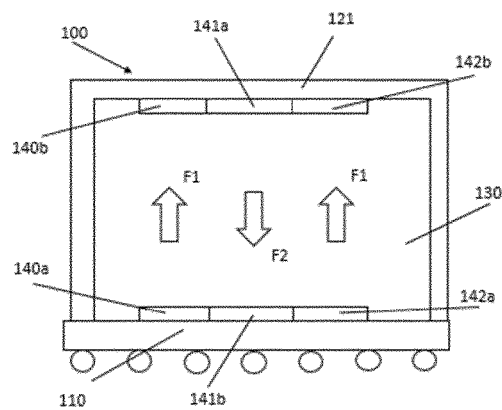
FIGS. 3a and 3b display exemplary configurations of flow units in relation to the heat generating component.
Figure 3B:
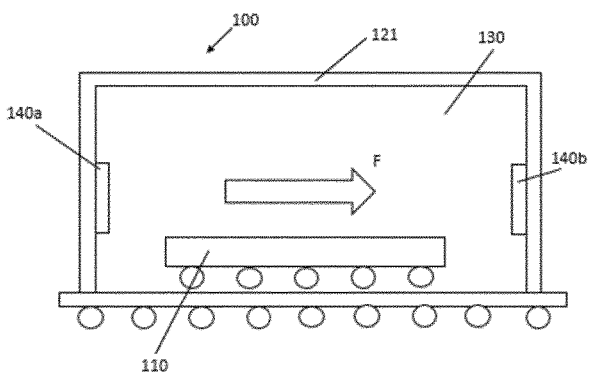

FIGS. 3a and 3b show embodiments of a thermal management system 100, which may be similarly configured as the embodiments shown in the previous figures. In the present examples, the flow unit placements represent different alternatives for directing the flow F of thermal management fluid 130 towards and away from the heat generating component 110.

FIG. 3a shows an embodiment in which electrodes 140a-142b are attached on the inner surface of the enclosure wall 121, and on the heat generating component 110. In this embodiment both the wall section 121 and the component 110 are provided with both first electrodes 140a-142a and second electrodes 140b-142b. The electrodes on the heat generating component 110 may comprise a second electrode 141b in the middle and two first electrodes 140a, 142a on the sides of the first electrode 141b. The opposite configuration is utilized on the enclosure wall 121, wherein second electrodes 140b,142b are arranged on the sides and the first electrode 141a in the middle. As a result, three separate flow units are formed. This may result in flow a F2 towards the heat generating component as well as flows F1 away from it.

FIG. 3b shows an embodiment in which the flow F is directed parallel to the heat generating component 110. This embodiment displays a variation which may be suitable if the upstream side of the component 110 is in greater need of cooling than the downstream side. This figure depicts the electrodes 140a,140b located on the sides of the component and may be attached to the inner wall of the enclosure. The first electrode 140a may direct the flow towards the component 110 and the second electrode 140b may direct the flow away from it. Similarly, the parallel flow direction F could as well be obtained with electrodes placed on the heat generating component.

Figure 4:
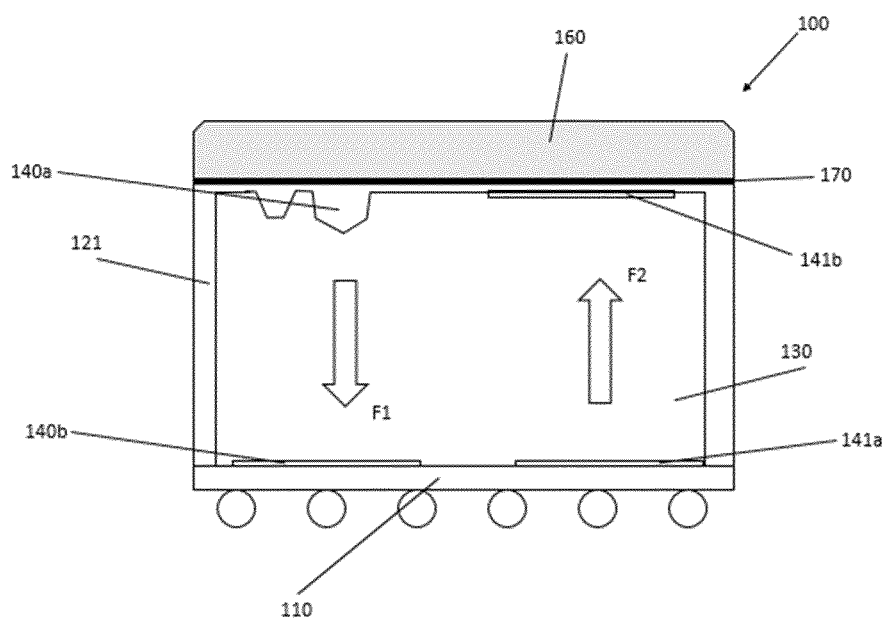
FIG. 4 is a schematic view of a thermal management system, with increased electrode surface according to one embodiment.

FIG. 4 is a schematic representation of a thermal management system 100, which may be configured in a similar way as any of the previously described embodiments. In the FIG. 4, the enclosure wall 121 may be configured to increase the efficiency of the flow units. This may for example be achieved by providing a rough shape of the part of the enclosure wall 121 comprising the first electrode 140a so as to increase the surface area of said electrode 140a. This increase could potentially facilitate flow F1. Furthermore, specific shapes, such as peaks, could further facilitate flow. In this specific embodiment, the heat generating component 110 comprises an entire wall section of the enclosure, and this heat generating device 110 may function as both a first electrode 141a and a second electrode 140b. Further, a heat exchanger 160 may be arranged in thermal contact with the enclosure wall 121. The heat exchanger 160 may for example be a heat pipe or heat sink for dissipating thermal energy from the enclosure, and thus indirectly from the heat generating device. Between the enclosure wall 121 and the heat exchanger 160 may, in this embodiment, a thermal interface material 170, for example graphene, be arranged for increased heat transfer.

Figure 5:
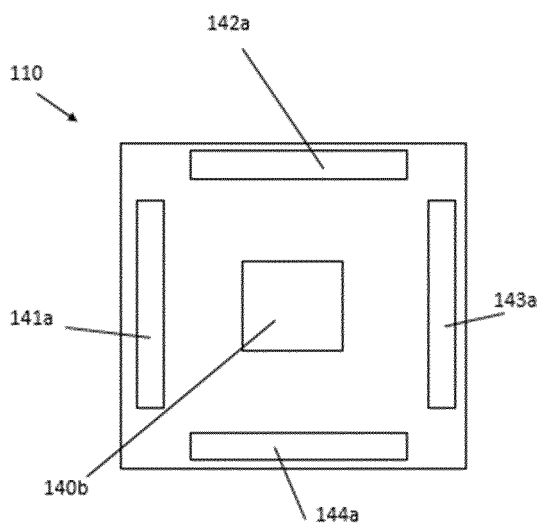
FIG. 5 is a top view of an embodiment of a heat generating component provided with electrodes.

FIG. 5 shows a top view of a heat generating component 110 to be cooled. The present component 110 may form part of an embodiment similar to the ones shown in the previous figures. In this instance the component 110 may be utilized as part of multiple flow units. On the component is an exemplary layout of first electrodes 141a-144a and a second electrode 140b illustrated. In this embodiment, the second, collector, electrode 140b is placed in the middle of the component whilst the emitting first electrodes 141a-144a are placed along the sides of the component. This could for example benefit cooling of the central area of the heat generating component and could create a tubular flow of thermal management fluid.

The invention claimed is:

1. An arrangement for thermal management of a heat generating electronic component, the arrangement comprising:
the heat generating electronic component arranged within an enclosure and in thermal contact with a dielectric liquid;
a first electrohydrodynamic (EHD) flow unit arranged within the enclosure, wherein the first EHD flow unit comprises a first electrode and a second electrode arranged offset from the first electrode, and wherein the first EHD flow unit controls a flow of the dielectric liquid between the first electrode and the second electrode; and
an enclosure wall at least partly defining the enclosure, wherein the enclosure wall is directly attached to the heat generating electronic component, thereby defining the enclosure.

2. The arrangement of claim 1, further comprising a second EHD flow unit arranged within the enclosure, the second EHD flow unit comprising a first electrode and a second electrode arranged offset from the first electrode, wherein:
the first EHD flow unit directs the flow towards the heat generating electronic component; and
the second EHD flow unit directs the flow away from the heat generating electronic component.

3. The arrangement of claim 2, wherein:
the second electrodes of the first and second EHD flow units operate as collector electrodes and are arranged on the heat generating electronic component and an inside of the enclosure wall;
the first electrode of the first EHD flow unit forms an emitter electrode arranged closer to the collector electrode arranged on the heat generating electronic component than to the collector electrode arranged on the inside of the enclosure wall; and
the first electrode of the second EHD flow unit forms an emitter electrode arranged closer to the collector electrode arranged on the inside of the enclosure wall than to the collector electrode arranged on the heat generating electronic component.

4. The arrangement of claim 1, wherein at least one of the first and second electrodes is arranged on the heat generating electronic component.

5. The arrangement of claim 4, wherein the at least one of the first and second electrodes is formed by an electrically conductive layer provided on a surface of the heat generating component.

6. The arrangement of claim 5, wherein the at least one of the first and second electrodes is formed by a graphene layer provided on the heat generating electronic component.

7. The arrangement of claim 4, wherein at least one of the first and second electrodes is arranged on an inside of the enclosure wall.

8. The arrangement of claim 1, wherein at least one of the first and second electrodes is arranged on an inside of the enclosure wall.

9. The arrangement of claim 1, further comprising a heat exchanger in thermal contact with the enclosure wall.

10. The arrangement of claim 9, further comprising a thermal interface material (TIM) arranged between the heat exchanger and an outside of the enclosure wall.

11. The arrangement of claim 10, wherein the TIM comprises graphene.

12. A method of thermal management of a heat generating electronic component, comprising:

placing the heat generating electronic component within an enclosure;

providing a dielectric liquid in thermal contact with the heat generating electronic component;

placing a first electrohydrodynamic (EHD) flow unit within the enclosure, wherein the first EHD flow unit comprises a first electrode and a second electrode arranged offset from the first electrode, and wherein the first EHD flow unit controls a flow of the dielectric liquid between the first electrode and the second electrode; and providing an enclosure wall to at least partly define the enclosure, wherein the enclosure wall is attached to the heat generating electronic component, thereby defining the enclosure.

13. The method of claim 12, further comprising directing the dielectric liquid flow towards the heat generating electronic component with the first EHD flow unit and directing the dielectric liquid flow away from the heat generating electronic component with a second EHD flow unit.

* * * * *